US012224215B2

(12) United States Patent
Huang et al.

(10) Patent No.: US 12,224,215 B2
(45) Date of Patent: Feb. 11, 2025

(54) DISPLAY DEVICE AND BONDING DETECTION METHOD OF DISPLAY DEVICE

(71) Applicants: Chengdu BOE Optoelectronics Technology Co., Ltd., Sichuan (CN); BOE Technology Group Co., Ltd., Beijing (CN)

(72) Inventors: Chienpang Huang, Beijing (CN); Kaifang Zhu, Beijing (CN); Chuntong Jiang, Beijing (CN); Wei Li, Beijing (CN)

(73) Assignees: Chengdu BOE Optoelectronics Technology Co., Ltd., Sichuan (CN); BOE Technology Group Co., Ltd., Beijing (CN)

(*) Notice: Subject to any disclaimer, the term of this patent is extended or adjusted under 35 U.S.C. 154(b) by 624 days.

(21) Appl. No.: 17/403,428

(22) Filed: Aug. 16, 2021

(65) Prior Publication Data

US 2022/0084894 A1    Mar. 17, 2022

(30) Foreign Application Priority Data

Sep. 11, 2020 (CN) .......................... 202010955204.6

(51) Int. Cl.
*H01L 21/66* (2006.01)
*G01R 31/28* (2006.01)

(52) U.S. Cl.
CPC .......... *H01L 22/32* (2013.01); *G01R 31/2812* (2013.01)

(58) Field of Classification Search
CPC .......... G01R 31/2812; G09G 2380/02; G09G 3/006; G09G 2300/0408; G09G 2330/12
See application file for complete search history.

(56) References Cited

U.S. PATENT DOCUMENTS 9,869,717 B2 * 1/2018 Lim ......................... G01R 1/06
11,470,716 B2 * 10/2022 Meng ................... H05K 5/0069
(Continued)

FOREIGN PATENT DOCUMENTS

| CN | 1498517 A | 5/2004 |
|----|-----------|--------|
| CN | 1557028 A | 12/2004 |

(Continued)

OTHER PUBLICATIONS

CN202010955204.6 first office action.
(Continued)

*Primary Examiner* — Jarrett J Stark
(74) *Attorney, Agent, or Firm* — IPro, PLLC

(57) ABSTRACT

A display device and a bonding detection method of the display device are provided. The display device includes: a display panel, a flexible circuit board and a chip on flex with a control chip, where the display panel is connected with the flexible circuit board through the chip on flex in a bonding manner, a first detection line located on the display panel, a second detection line extending to the flexible circuit board from one end of the first detection line through the chip on flex, and a third detection line extending to the flexible circuit board from the other end of the first detection line through the chip on flex, where a path where the second detection line is located is provided with at least two first test pins, and a path where the third detection line is located is provided with at least two second test pins.

10 Claims, 7 Drawing Sheets

(56) References Cited

U.S. PATENT DOCUMENTS

| | | |
|---|---|---|
| 2004/0150319 A1 | 8/2004 | Tomimatsu et al. |
| 2010/0258346 A1 | 10/2010 | Chen et al. |
| 2010/0295567 A1* | 11/2010 | Chang .................... G01R 31/70 |
| | | 324/719 |
| 2011/0152435 A1 | 6/2011 | Morishita et al. |
| 2011/0240966 A1 | 10/2011 | Lees et al. |
| 2011/0242792 A1 | 10/2011 | Choi |
| 2012/0043983 A1* | 2/2012 | Sawa ................. G01R 31/2891 |
| | | 324/750.19 |
| 2015/0160276 A1 | 6/2015 | Moon et al. |
| 2015/0263310 A1 | 9/2015 | Gong |
| 2016/0013440 A1 | 1/2016 | Luo et al. |
| 2016/0247436 A1* | 8/2016 | Lee ....................... G09G 3/2003 |
| 2016/0251551 A1 | 9/2016 | Wang et al. |
| 2021/0020082 A1* | 1/2021 | Wang .................... H01L 22/32 |
| 2021/0028250 A1* | 1/2021 | Wu ........................ H10K 71/70 |
| 2021/0091162 A1* | 3/2021 | Kim ..................... H10K 59/131 |
| 2021/0247859 A1* | 8/2021 | Gong .................... G09G 3/006 |
| 2022/0028308 A1* | 1/2022 | Yang .................... G09G 3/006 |
| 2022/0084894 A1* | 3/2022 | Huang ............... G01R 31/2812 |
| 2022/0085261 A1* | 3/2022 | Min ........................ H10K 59/88 |
| 2022/0115464 A1* | 4/2022 | Han ...................... H10K 71/70 |
| 2022/0309969 A1* | 9/2022 | Li .......................... G09G 3/006 |
| 2024/0004494 A1* | 1/2024 | Bang .................... G06F 3/0412 |
| 2024/0032195 A1* | 1/2024 | Kim ...................... H05K 1/189 |
| 2024/0047851 A1* | 2/2024 | Feng ..................... G06F 3/041 |

FOREIGN PATENT DOCUMENTS

| | | |
|---|---|---|
| CN | 102132440 A | 7/2011 |
| CN | 102159639 A | 8/2011 |
| CN | 103309092 A | 9/2013 |
| CN | 103436203 A | 12/2013 |
| CN | 104241547 A | 12/2014 |
| CN | 104393186 A | 3/2015 |
| CN | 105895825 A | 8/2016 |
| CN | 106910840 A | 6/2017 |
| CN | 107300793 A | 10/2017 |
| CN | 107359270 A | 11/2017 |
| CN | 108831362 A | 11/2018 |
| CN | 109546003 A | 3/2019 |
| CN | 110112323 A | 8/2019 |
| CN | 110867139 A | 3/2020 |
| CN | 111524450 A | 8/2020 |
| JP | 2011233341 A | 11/2011 |
| WO | 03030272 A2 | 4/2003 |

OTHER PUBLICATIONS

CN202010955204.6 second office action.
CN201910516258.X First Office Action.
CN201910516258.X Second Office Action.

* cited by examiner

DISPLAY DEVICE AND BONDING DETECTION METHOD OF DISPLAY DEVICE

This application claims priority to Chinese Patent Application No. 202010955204.6, filed on Sep. 11, 2020, which is hereby incorporated by reference in its entirety.

FIELD

The present disclosure relates to the field of display, in particular to a display device and a bonding detection method of the display device.

BACKGROUND

In a module process, a series of test pin (TP) pairs are generally designed to detect a bonding process, and if bonding is effective, the resistance between test point pairs should be within a reasonable range.

SUMMARY

The present disclosure provides a display device and a bonding detection method of the display device.

An embodiment of the present disclosure provides a display device, including: a display panel, a flexible circuit board and a chip on flex with a control chip, where the display panel is connected with the flexible circuit board through the chip on flex in a bonding manner. The display device further includes: a first detection line located on the display panel, a second detection line extending to the flexible circuit board from one end of the first detection line through the chip on flex, and a third detection line extending to the flexible circuit board from the other end of the first detection line through the chip on flex. A path where the second detection line is located is provided with at least two first test pins, and a path where the third detection line is located is provided with at least two second test pins.

In some embodiments, the second detection line and the third detection line are both closed loops; each closed loop includes: two first traces extending in a first direction on the chip on flex, a semi-closed first line frame located on the display panel, and a semi-closed second line frame located on the flexible circuit board, where the first direction is a direction pointing from the display panel to the flexible circuit board, and the first detection line is connected to the first line frame; and two ends of the first line frame are correspondingly butted with two ends of the two first traces respectively, and two ends of the second line frame are correspondingly butted with the other two ends of the two first traces respectively.

In some embodiments, the path where the second detection line is located is provided with the two first test pins, and the two first test pins are both located on the chip on flex; and the path where the third detection line is located is provided with the two second test pins, and the two second test pins are both located on the chip on flex.

In some embodiments, between the two first test pins of the closed loop, line resistance across the display panel is different from line resistance across the flexible circuit board.

In some embodiments, between the two first test pins of the closed loop, a trace length across the display panel is different from a trace length across the flexible circuit board.

In some embodiments, between the two first test pins of the closed loop, a trace width across the display panel is different from a trace width across the flexible circuit board.

In some embodiments, the second detection line and the third detection line are both line segments.

In some embodiments, the path where the second detection line is located is provided with the two first test pins, one of the first test pins on the path where the second detection line is located is located on the chip on flex, and the other first test pin is located on the flexible circuit board; and the path where the third detection line is located is provided with the two second test pins, one of the second test pins on the path where the third detection line is located is located on the chip on flex, and the other second test pin is located on the flexible circuit board.

In some embodiments, the second detection line and the third detection line are respectively located on two sides of the control chip; and the first detection line is in a semi-closed shape surrounding an edge of the display panel.

In some embodiments, the display panel is circular or elliptical.

An embodiment of the present disclosure further provides a bonding detection method of the display device as provided by the embodiment of the present disclosure. The bonding detection method includes: providing the display device; and determining a bonding state of a display panel and a chip on flex, a bonding state of the chip on flex and a flexible circuit board and a state of the display panel according to resistance between two first test pins on a path where a second detection line is located, resistance between two second test pins on a path where a third detection line is located, and resistance between any one of the first test pins on the path where the second detection line is located and any one of the second test pins on the path where the third detection line is located.

In some embodiments, the second detection line and the third detection line are closed loops, the two first test pins are both located on the chip on flex, and the two second test pins are both located on the chip on flex; and the the bonding state of the display panel and the chip on flex, the bonding state of the chip on flex and the flexible circuit board and the state of the display panel, according to the resistance between the two first test pins on the path where the second detection line is located, the resistance between the two second test pins on the path where the third detection line is located, and the resistance between any one of the first test pins on the path where the second detection line is located and any one of the second test pins on the path where the third detection line is located, includes:

when the resistance between the two first test pins is a first resistance value and/or the resistance between the two second test pins is a second resistance value, determining that the display panel and the chip on flex are in a poor bonding state, where the first resistance value is line resistance across the flexible circuit board between the two first test pins, and the second resistance value is line resistance across the flexible circuit board between the two second test pins;

when the resistance between the two first test pins is a third resistance value and/or the resistance between the two second test pins is a fourth resistance value, determining that the chip on flex and the flexible circuit board are in a poor bonding state, where the third resistance value is line resistance across the display panel between the two first test pins, and the fourth resistance value is line resistance across the display panel between the two second test pins;

when the resistance between the two first test pins is a fifth resistance value and the resistance between the two second test pins is a sixth resistance value, determining that the display panel and the chip on flex are in a bonding state, and the chip on flex and the flexible circuit board are in a bonding state, where the fifth resistance value is a parallel connection value of the line resistance across the display panel and the line resistance across the flexible circuit board between the two first test pins, and the sixth resistance value is a parallel connection value of the line resistance across the display panel and the line resistance across the flexible circuit board between the two second test pins; and when a resistance value between any one of the first test pins and any one of the second test pins is infinite, determining that the display panel is in a crack state, otherwise, determining that the display panel is in a good state.

In some embodiments, the second detection line and the third detection line are line segments, one of the first test pins on the path where the second detection line is located is located on the chip on flex, the other first test pin is located on the flexible circuit board, one of the second test pins on the path where the third detection line is located is located on the chip on flex, and the other second test pin is located on the flexible circuit board.

According to the resistance between the two first test pins on the path where the second detection line is located, the resistance between the two second test pins on the path where the third detection line is located, and the resistance between any one of the first test pins on the path where the second detection line is located and any one of the second test pins on the path where the third detection line is located, determining the bonding state of the display panel and the chip on flex, the bonding state of the chip on flex and the flexible circuit board and the state of the display panel, includes:

when the resistance between the two first test pins on the path where the second detection line is located is infinite, and/or when the resistance between the two second test pins on the third detection line is infinite, determining that the chip on flex and the flexible circuit board are in a poor bonding state, otherwise, determining that the chip on flex and the flexible circuit board are in a bonding state; and when a resistance value between any one of the first test pins and any one of the second test pins is infinite, determining that the display panel and the chip on flex are in a poor bonding state, otherwise, determining that the display panel and the chip on flex are in a bonding state.

An embodiment of the present disclosure further provides a display device. The display device includes: a display panel with a control chip and a flexible circuit board bonded with the display panel; the flexible circuit board has at least two test pin groups, and each test pin group includes a first test pin, a second test pin and a third test pin; and for any one of the test pin groups, the display device further includes: a first detection line located on the display panel, a second detection line extending from the first test pin to the display panel, a third detection line extending from the second test pin to the control chip, and a fourth detection line extending from the third test pin to the control chip; wherein a part of the second detection line located on the display panel is in short-circuit connection with a part of the third detection line located on the display panel, a part of the third detection line located on the control chip is in short-circuit connection with a part of the fourth detection line located on the control chip, one end of the first detection line is butted with the second detection line in one test pin group, and the other end of the first detection line is butted with the second detection line in the other test pin group.

In some embodiments, the two test pin groups are respectively located on two sides of a central axis of the control chip, the central axis is parallel to a direction pointing from the display panel to the flexible circuit board, and the first detection line is in a semi-closed shape surrounding an edge of the display panel.

In some embodiments, the display panel is circular or elliptical.

An embodiment of the present disclosure further provides a bonding detection method of the display device as provided by the embodiment of the present disclosure, including: determining a bonding state of a display panel and a flexible circuit board according to resistance between a first test pin and a second test pin; determining a bonding state of the display panel and a control chip according to resistance of the second test pin and third test pin; and determining a state of the display panel according to resistance between the first test pin in one test pin group and the first test pin in the other test pin group.

In some embodiments, determining the bonding state of the display panel and the flexible circuit board according to the resistance between the first test pin and the second test pin, includes: when the resistance in the first test pin and the second test pin in any one of the test pin groups is infinite, determining that the display panel and the flexible circuit board are in a poor bonding state, otherwise, determining that the display panel and the flexible circuit board are in a bonding state; determining the bonding state of the display panel and the control chip according to the resistance of the second test pin and the third test pin, includes: when the resistance in the second test pin and the third test pin in any one of the test pin groups is infinite, determining that the display panel and the control chip are in a poor bonding state, otherwise, determining that the display panel and the control chip are in a bonding state; and determining the state of the display panel according to the resistance between the first test pin in one test pin group and the first test pin in the other test pin group, includes: when the resistance between the first test pin in one test pin group and the first test pin in the other test pin group is infinite, determining that the display panel is in a crack state, otherwise, determining that the display panel is in a good state.

DETAILED DESCRIPTION OF THE EMBODIMENTS

Figure 1:
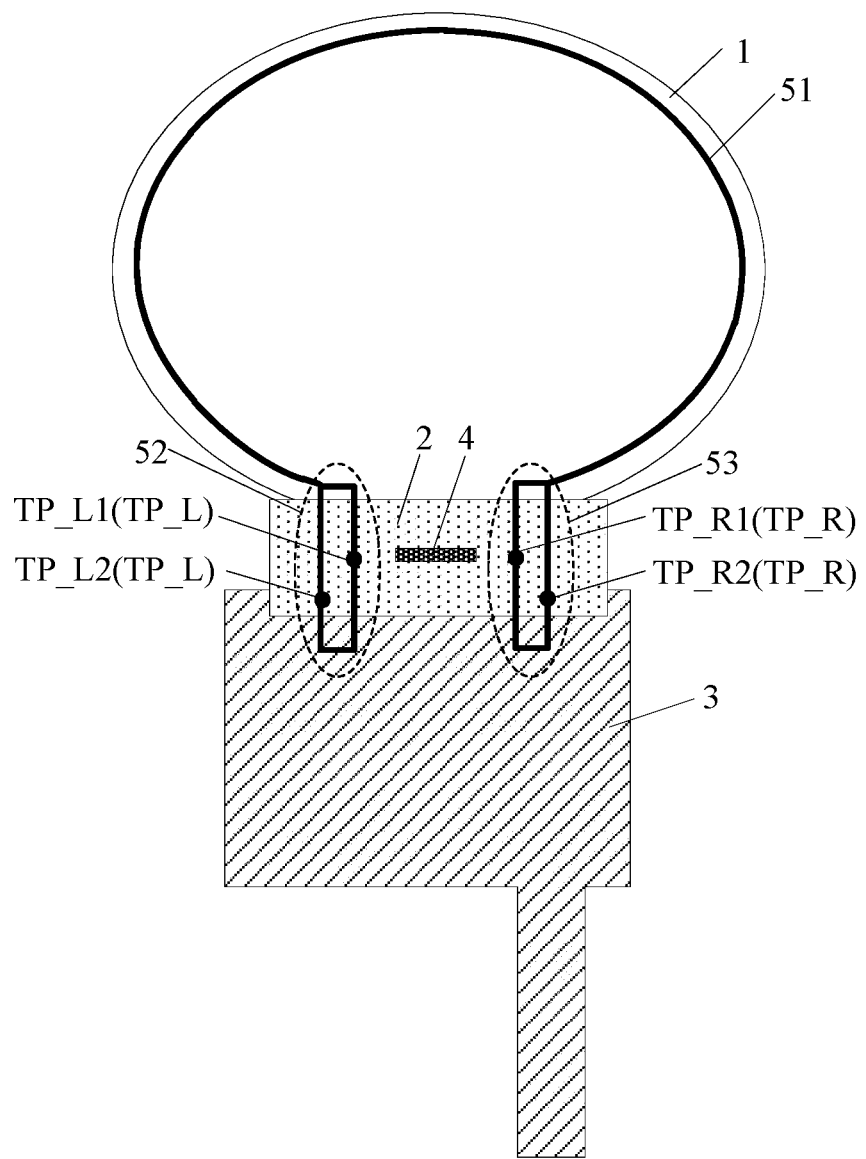
FIG. 1 is a schematic structural diagram of a display device provided by an embodiment of the present disclosure.

In order to make the objective, technical solutions and advantages of the embodiments of the present disclosure more clear, the technical solutions of the embodiments of the present disclosure will be clearly and fully described with reference to the accompanying drawings of the embodiments of the present disclosure. Obviously, the described embodiments are part of, but not all, embodiments of the present disclosure. Based on the described embodiments of the present disclosure, all other embodiments attainable by those ordinary skilled in the art without any inventive effort fall within the scope of the present disclosure.

Unless defined otherwise, technical or scientific terms used in the present disclosure shall have the ordinary meaning as understood by those ordinary skilled in the art to which the present disclosure belongs. The words 'first', 'second', and the like used in the present disclosure do not denote any order, quantity, or importance, but only used to distinguish different components. The word 'include' or 'comprise', and the like, means that an element or article preceding the word is inclusive of the element or article listed after the word and equivalents thereof, but does not exclude other elements or articles. The words 'connection' or 'coupling', and the like, are not limited to physical or mechanical connections, but may include electrical connections, whether direct or indirect. The terms 'up', 'down', 'left', 'right", and the like are used merely to denote a relative positional relationship that may change accordingly when the absolute position of an object being described changes.

In order to keep the following descriptions of the embodiments of the present disclosure clear and concise, detailed descriptions of known functions and known components are omitted in the present disclosure.

In a flexible display device, a common control chip (IC) is packaged with a chip on film (COF) and a chip on pi (COP). If the IC is packaged with the COF, two pairs of test points are required to detect a bonding process of a panel and a chip on flex, and the other two pairs are required to detect a bonding process of the chip on flex and a flexible circuit board (MFPC); and if the IC is packaged with the COP, the two pairs of test points are required to detect the bonding process of the panel and the MFPC, and the other two pairs are required to detect the bonding process of the IC and the panel. These TP pairs are independent pairwise, and at least 4 pairs of test points are needed no matter what the IC is packaged with. In addition, screen crack is often detected in screen failure analysis, which requires the use of panel crack design (PCD) detection. PCD detection is the design of a circle of metal trace around the panel, the metal trace is finally led to the test points of the MFPC, the crack condition is judged by detecting the conductivity of the test points on two sides, and usually, one pair of test points is required.

Narrow frames have become a development trend for mobile phones (e.g., active-matrix organic light-emitting diodes (AMOLED) or active-matrix organic light-emitting display panels) and watches, which means that narrower bonding regions are required. Meanwhile, in order to manufacture thinner and lighter products, mobile phone and watch manufacturers compress internal structures of the products, and a space for the MFPC is smaller and smaller. However, as a screen function increases, the more complex circuit is needed, the more and more auxiliary components are needed, and the space on the MFPC is precious. Sometimes other test points have to be deleted, which brings great inconvenience to screen parsing. While bonding test points are necessary and never allowed to be deleted, existing designs not only increase the bonding region width, but also the test points occupy the MFPC area, which are detrimental to module refinement.

Referring to FIG. 1, the embodiment of the present disclosure provides a display device, including: a display panel 1, a flexible circuit board 3 and a chip on flex 2 with a control chip 4. The display panel 1 is connected with the flexible circuit board 3 through the chip on flex 2 in a bonding manner.

The display device further includes: a first detection line 51 located on the display panel 1, a second detection line 52 extending to the flexible circuit board 3 from one end (such as the left end in FIG. 1) of the first detection line 51 through the chip on flex 2, and a third detection line 53 extending to the flexible circuit board 3 from the other end (such as the right end in FIG. 1) of the first detection line 51 through the chip on flex 2. A path where the second detection line 52 is located is provided with at least two first test pins TP_L (for example, TP_L1 and TP_L2 respectively), and a path where the third detection line 53 is located is provided with at least two second test pins TP_R (for example, TP_R1 and TP_R2 respectively).

In the embodiment of the present disclosure, the display device includes the first detection line 51, the second detection line 52 extending to the flexible circuit board 3 from one end of the first detection line 51 through the chip on flex 2, and the third detection line 53 extending to the flexible circuit board 3 from the other end of the first detection line 51 through the chip on flex 2, where the path where the second detection line 52 is located is provided with the at least two first test pins TP_L, the path where the third detection line 53 is located is provided with the at least two second test pins TP_R, and according to line resistance between the two first test pins TP_L, line resistance between the two second test pins TP_R and line resistance between one first test pin TP_L and one second test pin TP_R, a bonding state of the display panel 1 and the chip on flex 2, a bonding state of the chip on flex 2 and the flexible circuit board 3 and a state of the display panel 1 may be determined. Compared with the related art that a bonding state of a display panel 1 and a chip on flex 2, a bonding state of the chip on flex 2 and a flexible circuit board 3 and a state of the display panel 1 need to be detected through at least five pairs of test pins, by adopting an arrangement manner of the test pins provided by the embodiments of the present disclosure, the bonding state of the display panel 1 and the chip on flex 2, the bonding state of the chip on flex 2 and the flexible circuit board 3 and the state of the display panel 1 can be detected through the two pairs of test pins, the number of the test pins can be effectively reduced, and frame narrowing of the display device is facilitated.

During specific implementation, the second detection line 52 and the third detection line 53 may be closed loops or line segments, as exemplified below.

Figure 2:
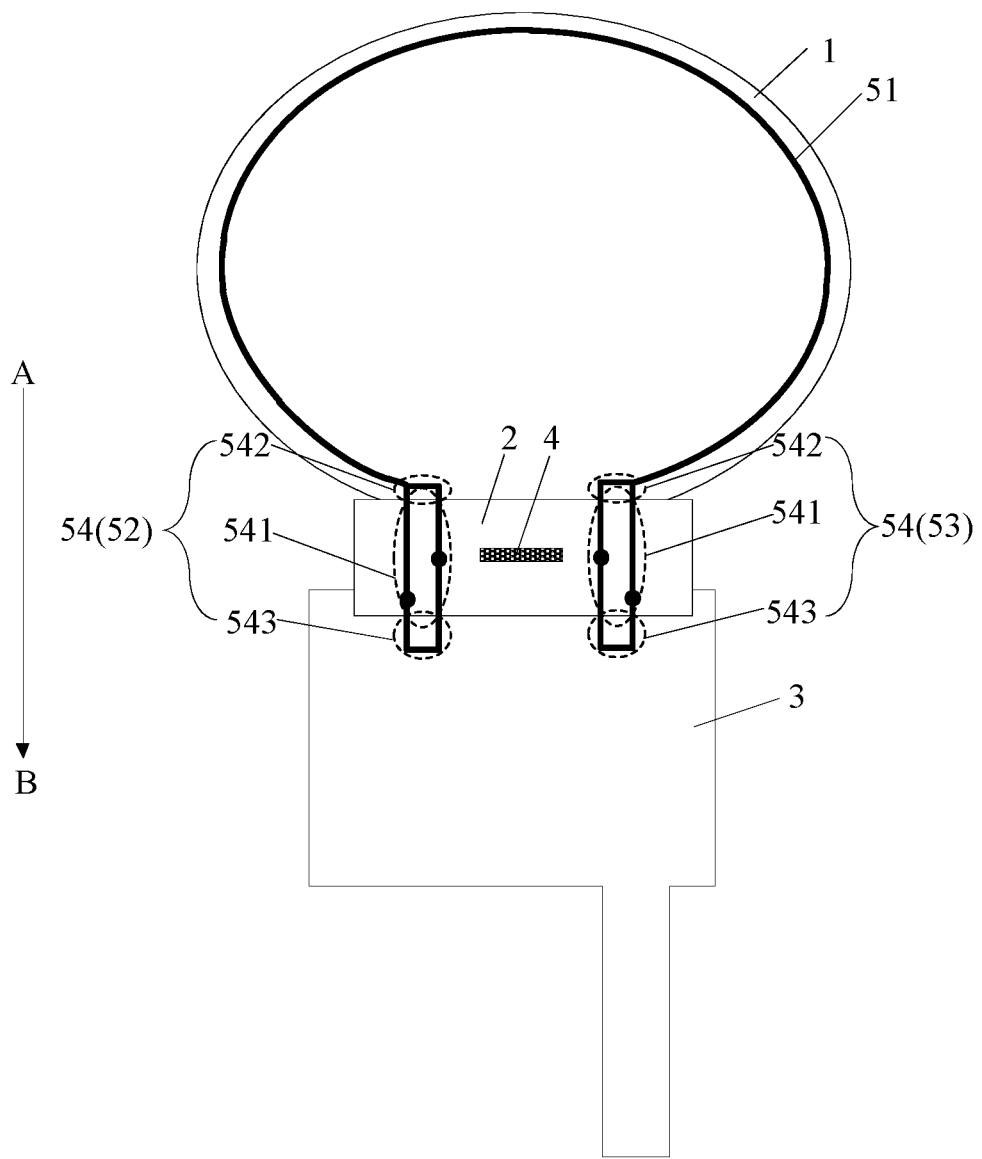
FIG. 2 is a schematic diagram of a specific configuration of a closed loop provided by an embodiment of the present disclosure.

As shown in combination with FIG. 1 and FIG. 2, the second detection line 52 and the third detection line 53 are both the closed loops 54. Each closed loop 54 includes: two first traces 541 extending in a first direction AB on the chip on flex 2, a semi-closed first line frame 542 located on the display panel 1 and a semi-closed second line frame 543 located on the flexible circuit board 3, where the first direction AB is a direction pointing from the display panel 1 to the flexible circuit board 3, and the first detection line 51 is connected to the first line frame 542. Two ends of the first line frame 542 are correspondingly butted with two ends of the two first traces 541 respectively, and two ends of the second line frame 543 are correspondingly butted with the other two ends of the two first traces 541 respectively.

Specifically, as shown in combination with FIG. 2, in the closed loop 54 of the second detection line 52, a left end of the first line frame 542 is connected with an upper end of the first trace 541 on a left side, a right end of the first line frame 542 is connected with an upper end of the first trace 541 on a right side, a left end of the second line frame 543 is connected with a lower end of the first trace 541 on the left side, and a right end of the second line frame 543 is connected with a lower end of the first trace 541 on the right side. In the closed loop 54 of the third detection line 53, the left end of the first line frame 542 is connected with the upper end of the first trace 541 on the left side, the right end of the first line frame 542 is connected with the upper end of the first trace 541 on the right side, the left end of the second line frame 543 is connected with the lower end of the first trace 541 on the left side, and the right end of the second line frame 543 is connected with the lower end of the first trace 541 on the right side.

Specifically, as shown in combination with FIG. 1 or FIG. 2, the path where the second detection line 52 is located is provided with the two first test pins TP_L, both of which are located on the chip on flex 2; and the path where the third detection line 53 is located is provided with the two second test pins TP_R, both of which are located on the chip on flex 2. In the embodiment of the present disclosure, the bonding detection of the display panel 1 and the flexible circuit board 3, the bonding detection of the chip on flex 2 and the flexible circuit board 3 and the detection of a crack state of the display panel 1 can be realized by only using two pairs of test pins, so that frame narrowing of the display device is facilitated, and moreover, the test pins are all disposed on the chip on flex 2, so that a plurality of bonding positions is detected advantageously through a small number of test pins. Of course, the path where the second detection line 52 is located may also be provided with the more first test pins TP_L, and the path where the third detection line 53 is located may also be provided with the more second test pins TP_R.

Specifically, between the two first test pins TP_L of the closed loop 54, line resistance across the display panel 1 is different from line resistance across the flexible circuit board 3. Specifically, it is possible to control that the line resistance across the display panel 1 is different from the line resistance across the flexible circuit board 3 by a trace length or a trace width, that is, in one manner, between the two first test pins TP_L of the closed loop 54, the trace length across the display panel 1 is different from the trace length across the flexible circuit board 3; and in another manner, between the two first test pins TP_L of the closed loop 54, the trace width across the display panel 1 is different from the trace width across the flexible circuit board 3.

Figure 3A:
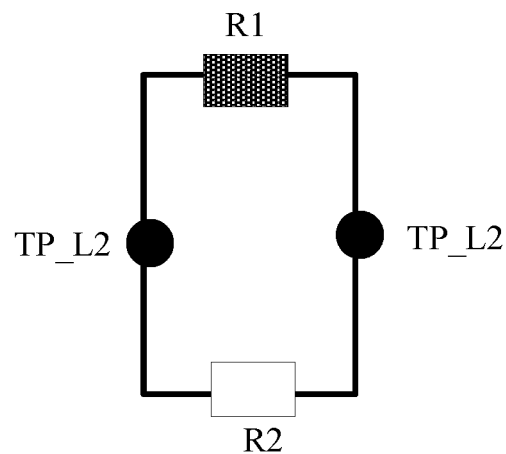
FIG. 3A is a schematic diagram of an equivalent circuit between a first test pin and a second test pin provided by an embodiment of the present disclosure.
Figure 3B:
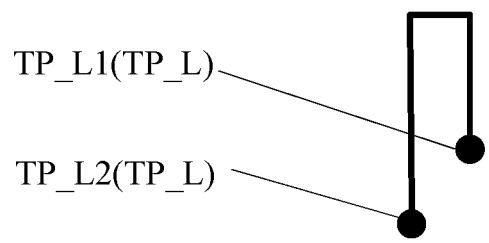
FIG. 3B is a schematic diagram of a trace across a display panel between a first test pin and a second test pin provided by an embodiment of the present disclosure.
Figure 3C:
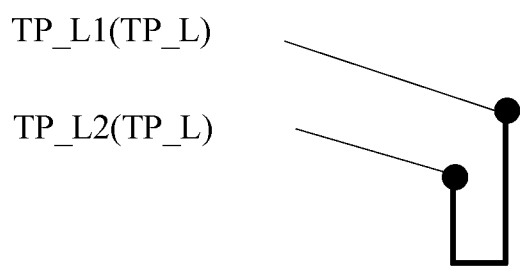
FIG. 3C is a schematic diagram of a trace across a flexible circuit board between a first test pin and a second test pin provided by an embodiment of the present disclosure.

For the arrangement manner of the test pins as shown in FIG. 1, the resistance between the two first test pins TP_L (TP_L1 and TP_L2) can be seen as parallel connection of first resistance R1 and second resistance R2, as shown in FIG. 3A. The first resistance R1 is bonding resistance of the display panel 1 and the chip on flex 2 (namely, trace resistance across the display panel 1 between the two first test pins TP_L of the closed loop 54, as shown in FIG. 3B), and the second resistance R2 is bonding resistance of the chip on flex 2 and the flexible circuit board 3 (namely, trace resistance across the flexible circuit board 3 between the two first test pins TP_L of the closed loop 54, as shown in FIG. 3C). Generally, the first resistance R1 and the second resistance R2 are several Ohms, so the resistance between the two test pins is (R1*R2)/(R1+R2). In general, poor bonding causes the first resistance R1 or the second resistance R2 to be broken, and the first resistance R1 and the second resistance R2 are not equal by designing resistance values of the first resistance R1 and the second resistance R2. Thus, when the chip on flex 2 and the display panel 1 are in poor bonding, R1=+∞, and the resistance between the two first test pins TP_L (TP_L1 and TP_L2) is equal to the second resistance R2; when the chip on flex 2 and the flexible circuit board 3 are in poor bonding, the second resistance R2=+∞, and the resistance between the two first test pins TP_L (TP_L1 and TP_L2) is equal to the first resistance R1; and when the display panel 1 and the chip on flex 2 as well as the chip on flex 2 and the flexible circuit board 3 are in good bonding, the resistance between the two first test pins TP_L (TP_L1 and TP_L2) is equal to (R1*R2)/(R1+R2). Similarly, the two second test pins TP_R (TP_R1 and TP_R2) can detect the bonding effect on the right. The crack condition of the display panel 1 can be measured between one of the any two TP_R and one of the TP_L.

In actual production, the chip on flex 2 and the display panel 1 are usually bonded first, the bonding effect of the chip on flex 2 and the display panel 1 can be verified only after the flexible circuit board 3 is bonded in a traditional solution, and the solution provided by the embodiment of the present disclosure can timely detect the validity of each bonding stage, thereby bringing convenience to production. That is, after the display panel 1 and the chip on flex 2 are bonded, the bonding effect of the display panel 1 and the chip on flex 2 can be detected without bonding the chip on flex 2 with the flexible circuit board 3. In addition, for the design of the chip on flex 2 in the embodiment of the present disclosure, only one outer lead bonding (OLB) is required to be pulled to be connected with an internal pin bonding (ILB), only lines of test points are added, personalized design according to different types of display devices is not required, the test points may also be configured to design test of other signals, and universality is high.

Figure 4:
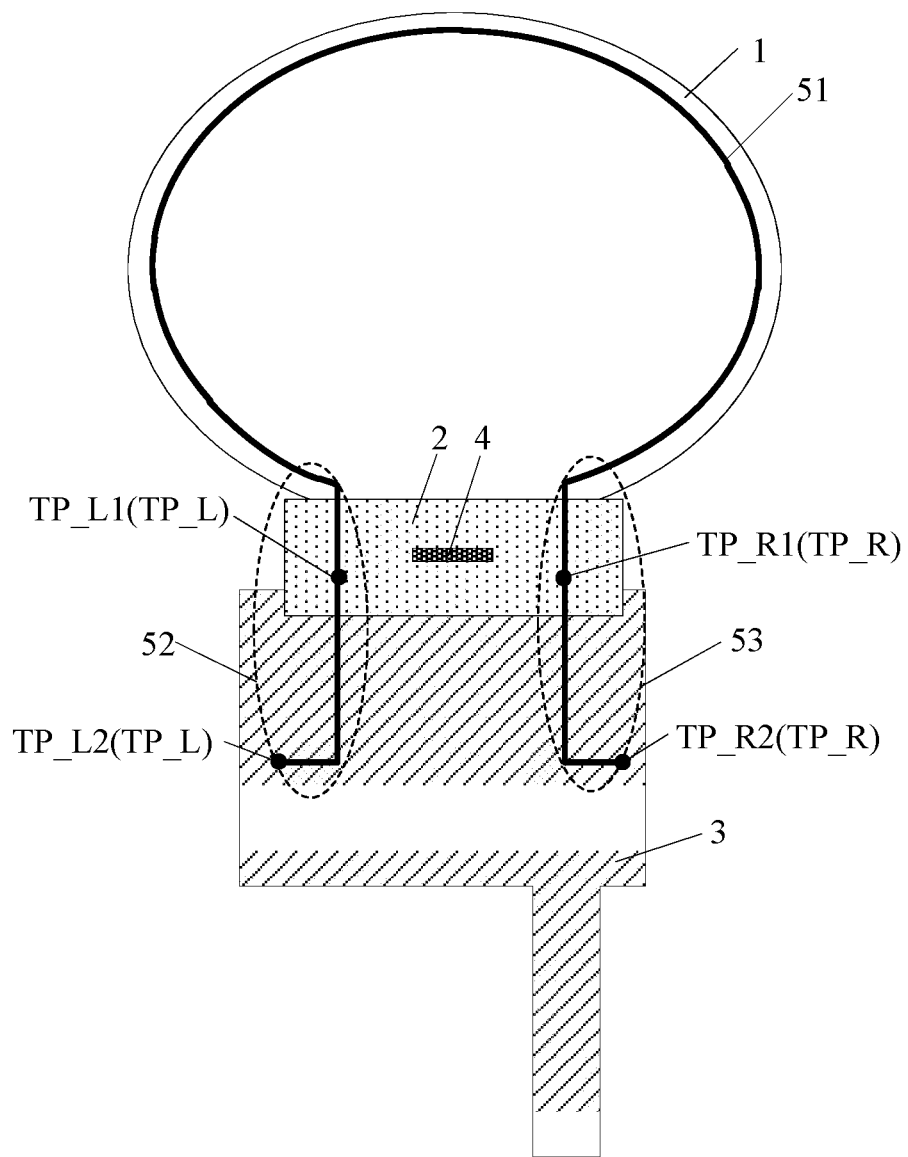
FIG. 4 is a schematic structural diagram of another display device provided by an embodiment of the present disclosure.

For another example, referring to FIG. 4, the second detection line 52 and the third detection line 53 are the line segments, which may be unclosed bending structures composed of two line segments. Specifically, the path where second detection line 52 is located is provided with the two first test pins TP_L (for example, TP_L1 and TP_L2 respectively), one of the first test pins TP_L (TP_L1) on the path where the second detection line 52 is located is located on the chip on flex 2, and the other first test pin TP_L (TP_L2) is located on the flexible circuit board 3; and the path where the third detection line 53 is located is provided with the two second test pins TP_R (for example, TP_R1 and TP_R2 respectively), one of the second test pins TP_R (TP_R1) on the path where the third detection line 53 is located is located on the chip on flex 2, and the other second test pin TP_R (TP_R2) is located on the flexible circuit board 3.

For the arrangement manner of the test pins as shown in FIG. 4, in consideration of production line personnel, the simplest way to distinguish whether the bonding is good or bad is to judge on-off, rather than to judge the magnitude of a resistance value, the two first test pins TP_L (TP_L1 and TP_L2), and the two second test pins TP_R (TP_R1 and TP_R2) can respectively detect the bonding effects of the chip on flex 2 and the left and the right of the flexible circuit board 3, and due to the extremely low probability of panel crack, a conduction condition of any one of the two first test pins TP_L and the two second test pins TP_R can measure the bonding effect between the display panel 1 and the chip on flex 2. In addition, the solution is the simplest one for wiring, and is beneficial to frame narrowing of the display device.

During specific implementation, as shown in combination with FIG. 1, FIG. 2 and FIG. 4, the second detection line 52 and the third detection line 53 are respectively located on two sides of the control chip 4; and the first detection line 51 is in a semi-closed shape surrounding an edge of the display panel 1. Specifically, if the display panel 1 is circular or elliptical, the first detection line 51 is in an unclosed circular or elliptical shape surrounding the edge of the display panel 1. Of course, if the display panel is in other shapes, the shape of the first detection line 51 may be similar to that of the display panel, for example, the display panel is in a rectangular shape, and the first detection line 51 may be in an unclosed rectangular shape.

During specific implementation, the display panel 1 is circular or elliptical. Because the circular or elliptical display panel has the higher requirement for the bonding width, the arrangement manner of the test pins provided by the embodiment of the present disclosure can well solve the problems that the circular or elliptical display panel is smaller in bonding width and difficult in bonding.

Figure 6:
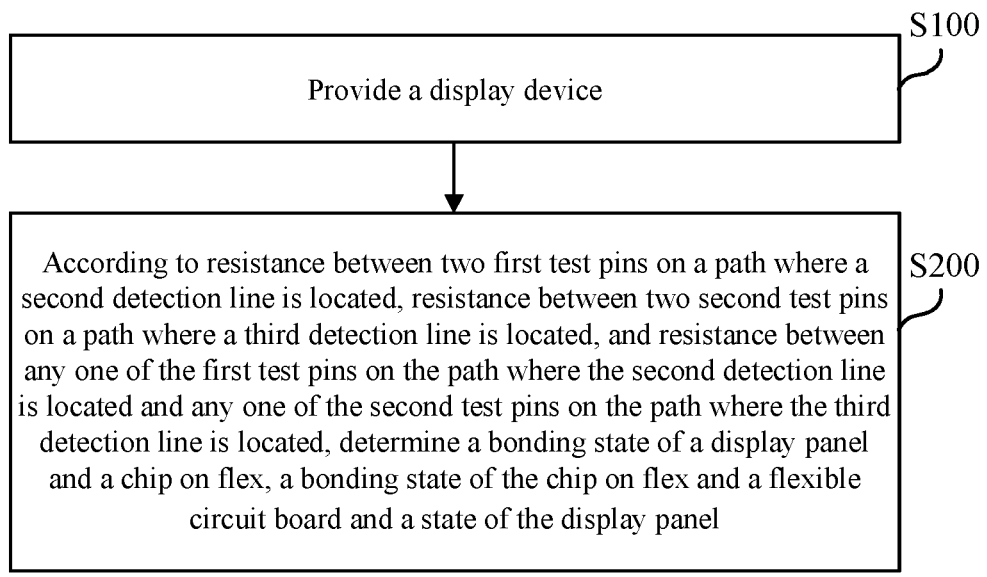
FIG. 6 is a schematic flow diagram of a bonding detection method of a display device provided by an embodiment of the present disclosure.

Based on the same inventive concept, the embodiment of the present disclosure further provides a bonding detection method of the display device (exemplified by the display devices shown in FIG. 1, FIG. 2 and FIG. 4) as provided by the embodiments of the present disclosure. Referring to FIG. 6, the bonding detection method includes S100 and S200.

S100, the display device is provided.

S200, according to resistance between two first test pins on a path where a second detection line is located, resistance between two second test pins on a path where a third detection line is located, and resistance between any one of the first test pins on the path where the second detection line is located and any one of the second test pins on the path where the third detection line is located, a bonding state of a display panel and a chip on flex, a bonding state of the chip on flex and a flexible circuit board and a state of the display panel are determined.

Specifically, for the display device be the display device shown in FIG. 1 or FIG. 2, that is, the second detection line 52 and the third detection line 53 are the closed loops 54, the two first test pins TP_L are located on the chip on flex 2, and the two second test pins TP_L are located on the chip on flex 2. The S200 that according to the resistance between the two first test pins on the path where the second detection line is located, the resistance between the two second test pins on the path where the third detection line is located, and the resistance between any one of the first test pins on the path where the second detection line is located and any one of the second test pins on the path where the third detection line is located, the bonding state of the display panel and the chip on flex, the bonding state of the chip on flex and the flexible circuit board and the state of the display panel are determined, includes: S210, S220, S230 and S240.

S210, when the resistance between the two first test pins TP_L is a first resistance value and/or the resistance between the two second test pins TP_R is a second resistance value, it is determined that the display panel 1 and the chip on flex 2 are in a poor bonding state, where the first resistance value is line resistance (that is, resistance of a trace section in FIG. 3c) across the flexible circuit board 3 between the two first test pins TP_L, and the second resistance value is line resistance across the flexible circuit board 3 between the two second test pins TP_R.

S220, when the resistance between the two first test pins TP_L is a third resistance value and/or the resistance between the two second test pins TP_R is a fourth resistance value, it is determined that the chip on flex 2 and the flexible circuit board 3 are in a poor bonding state, where the third resistance value is line resistance (that is, resistance of a trace section in FIG. 3b) across the display panel 1 between the two first test pins TP_L, and the fourth resistance value is line resistance across the display panel between the two second test pins TP_R.

S230, when the resistance between the two first test pins TP_L is a fifth resistance value and the resistance between the two second test pins TP_R is a sixth resistance value, it is determined that the display panel 1 and the chip on flex 2 are in a bonding state and the chip on flex 2 and the flexible circuit board 3 are in a bonding state, wherein the fifth resistance value is a parallel connection value of the line resistance across the display panel 1 and the line resistance across the flexible circuit board 3 between the two first test pins TP_L, that is, (R1*R2)/(R1+R2), and the sixth resistance value is a parallel connection value of the line resistance across the display panel 1 and the line resistance across the flexible circuit board 3 between the two second test pins TP_R.

S240, when a resistance value between any one of the first test pins TP_L and any one of the second test pins TP_R is infinite, it is determined that the display panel 1 is in a crack state, otherwise, it is determined that the display panel 1 is in a good state.

Specifically, for the display device be the display device shown in FIG. 4, that is, the second detection line 52 and the third detection line 53 are the line segments, one of the first test pins TP_L on the path where the second detection line 52 is located is located on the chip on flex 2, the other first test pin TP_L is located on the flexible circuit board 3, one of the second test pins TP_R on the path where the third detection line 53 is located is located on the chip on flex 2, and the other second test pin TP_R is located on the flexible circuit board 3. The S200 that according to the resistance between the two first test pins on the path where the second detection line is located, the resistance between the two second test pins on the path where the third detection line is located, and the resistance between any one of the first test pins on the path where the second detection line is located and any one of the second test pins on the path where the third detection line is located, the bonding state of the display panel and the chip on flex, the bonding state of the chip on flex and the flexible circuit board and the state of the display panel are determined, includes: S250 and S260.

S250, when the resistance between the two first test pins TP_L on the path where the second detection line 52 is located is infinite, and/or when the resistance between the two second test pins TP_R on the third detection line 53 is infinite, it is determined that the chip on flex 2 and the flexible circuit board 3 are in a poor bonding state, otherwise, it is determined that the chip on flex 2 and the flexible circuit board 3 are in a bonding state.

S260, when a resistance value between any one of the first test pins TP_L and any one of the second test pins TP_R is infinite, it is determined that the display panel 1 and the chip on flex 2 are in a poor bonding state, otherwise, it is determined that the display panel 1 and the chip on flex 2 are in a bonding state.

Figure 5:
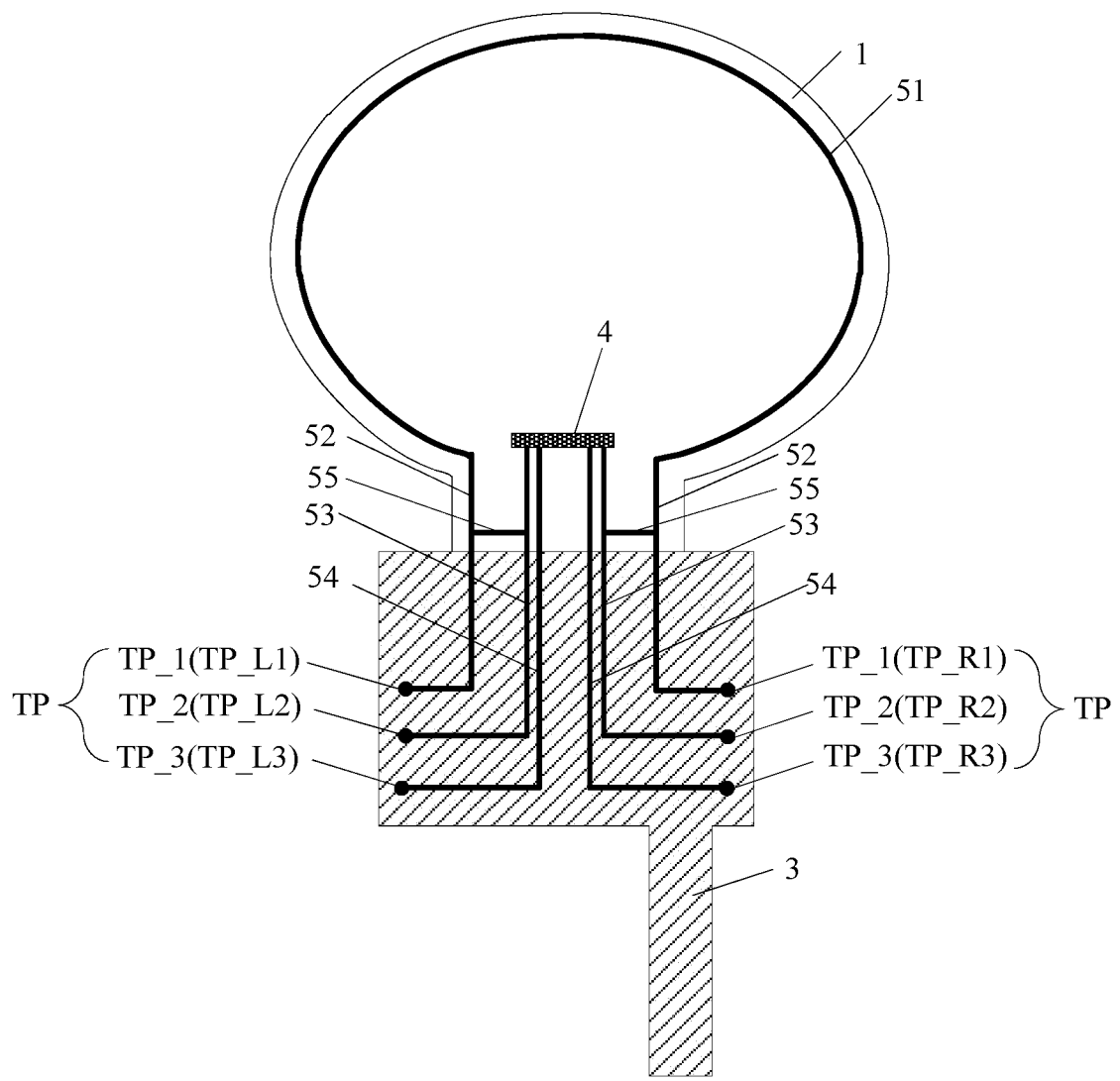
FIG. 5 is a schematic structural diagram of further display device provided by an embodiment of the present disclosure.

An embodiment of the present disclosure further provides a display device, as shown in FIG. 5, including: a display panel 1 with a control chip 4 and a flexible circuit board 3 bonded with the display panel 1.

The flexible circuit board 3 has at least two test pin groups TP, and each test pin group TP includes a first test pin TP_1, a second test pin TP_2 and a third test pin TP_3.

For any one of the test pin groups TP, the display device further includes: a first detection line 51 located on the display panel 1, a second detection line 52 extending from the first test pin TP_1 to the display panel 1, a third detection line 53 extending from the second test pin TP_2 to the control chip 4, and a fourth detection line 54 extending from the third test pin TP_3 to the control chip 4; where a part of the second detection line 52 located on the display panel 1 is in short-circuit connection with a part of the third detection line 53 located on the display panel 1 (as shown in FIG. 5, the second detection line 52 and the third detection line 53 are in short-circuit connection through a connection line 55 located on the display panel 1), a part of the third detection line 53 located on the control chip 4 is in short-circuit connection with a part of the fourth detection line 54 located on the control chip 4 (the third detection line 53 and the fourth detection line 54 which correspond to the same test pin group TP are in short-circuit connection in the control chip 4), one end (e.g. a left end in FIG. 5) of the first detection line 51 is butted with the second detection line 52 in one test pin group TP (e.g. the test pin group TP on a left side in FIG. 5), and the other end (e.g. a right end in FIG. 5) of the first detection line 51 is butted with the second detection line 52 in the other test pin group TP (e.g. the test pin group TP on a right side in FIG. 5).

For the arrangement manner of the test pins as shown in FIG. 5, that is, the control chip 4 is located on the display panel 1 (the IC packaged with COP), the bonding effect of the panel 1 and the flexible circuit board 3 and the bonding effect of the control chip 4 and the panel 1 need to be detected. Specifically, screen crack can be detected through the first test pin TP_1 in one test pin group TP and the first test pin TP_1 in the other test pin group TP; the second test pin TP_L2 and the first test pin TP_L1 in one test pin group TP, and the first test pin TP_R1 and the second test pin TP_R2 in the other test pin group TP can detect the bonding effect of the display panel 1 and the flexible circuit board 3; and the third test pin TP_L3 and the second test pin TP_L2 in one test pin group TP, and the third test pin TP_R3 and the second test pin TP_R2 in the other test pin group TP can detect the bonding effect of the control chip 4 and the display panel 1.

Specifically, the two test pin groups TP are respectively located on two sides of a central axis CD of the control chip 4, the central axis CD is parallel to a direction pointing from the display panel 1 to the flexible circuit board 3, and the first detection line 51 is in a semi-closed shape surrounding the edge of the display panel. Specifically, if the display panel 1 is circular or elliptical, the first detection line 51 is in an unclosed circular or elliptical shape surrounding the edge of the display panel 1. Of course, if the display panel is in other shapes, the shape of the first detection line 51 may be similar to that of the display panel, for example, the display panel is in a rectangular shape, and the first detection line 51 may be in an unclosed rectangular shape.

During specific implementation, the display panel 1 is circular or elliptical. Because the circular or elliptical display panel has the higher requirement for the bonding width, the arrangement manner of the test pins provided by the embodiment of the present disclosure can well solve the problems that the circular or elliptical display panel is smaller in bonding width and difficult in bonding.

Figure 7:
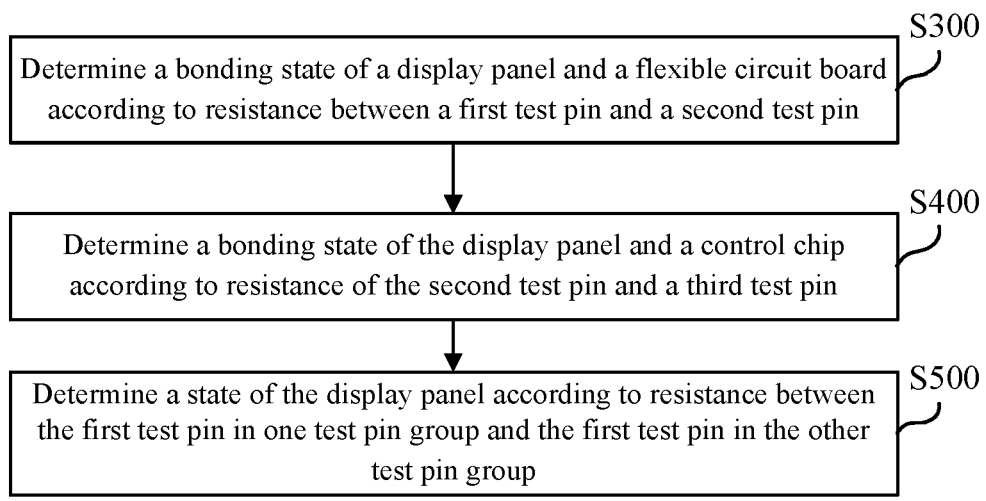
FIG. 7 is a schematic flow diagram of another bonding detection method of a display device provided by an embodiment of the present disclosure.

Based on the same inventive concept, an embodiment of the present disclosure further provides a bonding detection method of the display device as provided by the embodiment of the present disclosure. Referring to FIG. 7, the bonding detection method includes S300, S400 and S500.

S300, a bonding state of a display panel and a flexible circuit board is determined according to resistance between a first test pin and a second test pin, specifically, when the resistance in the first test pin and the second test pin in any one of test pin groups is infinite, it is determined that the display panel and the flexible circuit board are in a poor bonding state, otherwise, it is determined that the display panel and the flexible circuit board are in a bonding state.

S400, a bonding state of the display panel and a control chip is determined according to resistance of the second test pin and a third test pin, specifically, when the resistance in the second test pin and the third test pin in any one of the test pin groups is infinite, it is determined that the display panel and the control chip are in a poor bonding state, otherwise, it is determined that the display panel and the control chip are in a bonding state.

S500, a state of the display panel is determined according to the resistance between the first test pin in one test pin group and the first test pin in the other test pin group, specifically, when the resistance between the first test pin in one test pin group and the first test pin in the other test pin group is infinite, it is determined that the display panel is in a crack state, otherwise, it is determined that the display panel is in a good state.

The embodiments of the present disclosure have the following beneficial effects: the display device includes the first detection line, the second detection line extending to the flexible circuit board from one end of the first detection line through the chip on flex, and the third detection line extending to the flexible circuit board from the other end of the first detection line through the chip on flex, where the path where the second detection line is located is provided with the at least two first test pins, the path where the third detection line is located is provided with the at least two second test pins, and further, according to the line resistance between the two first test pins, the line resistance between the two second test pins and the line resistance between one first test pin and one second test pin, the bonding state of the display panel and the chip on flex, the bonding state of the chip on flex and the flexible circuit board and the state of the display panel may be determined. Compared with the related art that a bonding state of a display panel and a chip on flex, a bonding state of the chip on flex and a flexible circuit board and a state of the display panel need to be detected through at least five pairs of test pins, through the arrangement manner of the test pins provided by the embodiments of the present disclosure, the bonding state of the display panel and the chip on flex, the bonding state of the chip on flex and the flexible circuit board and the state of the display panel can be detected through the two pairs of test pins, the number of the test pins can be effectively reduced, and frame narrowing of the display device is facilitated.

It will be apparent to those skilled in the art that various modifications and variations can be made to the present disclosure without departing from the spirit or scope of the present disclosure. Thus, it is intended that the present disclosure covers the modifications and variations if these modifications and variations of the present disclosure fall within the scope of the appended claims of the present disclosure and their equivalents.

What is claimed is:

1. A display device, comprising:
a display panel;
a flexible circuit board;
a chip on film with a control chip, wherein the display panel is connected with the flexible circuit board through the chip on film in a bonding manner;
a first detection line located on the display panel;
a second detection line extending to the flexible circuit board from one end of the first detection line through the chip on film; and
a third detection line extending to the flexible circuit board from the other end of the first detection line through the chip on film;
wherein a path where the second detection line is located is provided with at least two first test pins, and a path where the third detection line is located is provided with at least two second test pins;
the second detection line and the third detection line are both closed loops;
wherein each of the closed loops comprises:
two first traces extending in a first direction on the chip on film,
a semi-closed first line frame located on the display panel, and
a semi-closed second line frame located on the flexible circuit board,
wherein the first direction is a direction pointing from the display panel to the flexible circuit board, and the first detection line is connected to the first line frame; and
two ends of the first line frame are correspondingly butted with two ends of the two first traces respectively, and two ends of the second line frame are correspondingly butted with the other two ends of the two first traces respectively.

2. The display device according to claim 1, wherein the path where the second detection line is located is provided with the two first test pins, and the two first test pins are both located on the chip on film; and
the path where the third detection line is located is provided with the two second test pins, and the two second test pins are both located on the chip on film.

3. The display device according to claim 2, wherein between the two first test pins of the each closed loop, line resistance across the display panel is different from line resistance across the flexible circuit board.

4. The display device according to claim 3, wherein between the two first test pins of the each closed loop, a trace length across the display panel is different from a trace length across the flexible circuit board.

5. The display device according to claim 3, wherein between the two first test pins of the each closed loop, a trace width across the display panel is different from a trace width across the flexible circuit board.

6. The display device according to claim 1, wherein the second detection line and the third detection line are respectively located on two sides of the control chip; and the first detection line is in a semi-closed shape surrounding an edge of the display panel.

7. The display device according to claim 1, wherein the display panel is circular or elliptical.

8. A bonding detection method of the display device according to claim 1, comprising:
providing the display device; and
according to resistance between two first test pins on the path where the second detection line is located, resistance between two second test pins on the path where the third detection line is located, and resistance between any one of the first test pins on the path where the second detection line is located and any one of the second test pins on the path where the third detection line is located, determining a bonding state of the display panel and the chip on film, a bonding state of the chip on film and the flexible circuit board and a state of the display panel.

9. The bonding detection method according to claim 8, wherein the second detection line and the third detection line are closed loops, the two first test pins are both located on the chip on film, and the two second test pins are both located on the chip on film; and
according to the resistance between the two first test pins on the path where the second detection line is located, the resistance between the two second test pins on the path where the third detection line is located, and the resistance between any one of the first test pins on the path where the second detection line is located and any one of the second test pins on the path where the third detection line is located, the determining the bonding state of the display panel and the chip on film, the bonding state of the chip on film and the flexible circuit board and the state of the display panel, comprises:
when the resistance between the two first test pins is a first resistance value and/or the resistance between the two second test pins is a second resistance value, determining that the display panel and the chip on film are in a poor bonding state, wherein the first resistance value is line resistance across the flexible circuit board between the two first test pins, and the second resistance value is line resistance across the flexible circuit board between the two second test pins;
when the resistance between the two first test pins is a third resistance value and/or the resistance between the two second test pins is a fourth resistance value, determining that the chip on film and the flexible circuit board are in a poor bonding state, wherein the third resistance value is line resistance across the display panel between the two first test pins, and the fourth resistance value is line resistance across the display panel between the two second test pins;
when the resistance between the two first test pins is a fifth resistance value and the resistance between the two second test pins is a sixth resistance value, determining that the display panel and the chip on film are in a bonding state, and the chip on film and the flexible circuit board are in a bonding state, wherein the fifth resistance value is a parallel connection value of the line resistance across the display panel and the line resistance across the flexible circuit board between the two first test pins, and the sixth resistance value is a parallel connection value of the line resistance across the display panel and the line resistance across the flexible circuit board between the two second test pins; and
when a resistance value between any one of the first test pins and any one of the second test pins is infinite, determining that the display panel is in a crack state; when the resistance value between any one of the first test pins and any one of the second test pins is not infinite, determining that the display panel is in a good state.

10. The bonding detection method according to claim 8, wherein the second detection line and the third detection line are line segments, one of the first test pins on the path where the second detection line is located is located on the chip on film, the other first test pin is located on the flexible circuit board, one of the second test pins on the path where the third detection line is located is located on the chip on film, and the other second test pin is located on the flexible circuit board; and according to the resistance between the two first test pins on the path where the second detection line is located, the resistance between the two second test pins on the path where the third detection line is located, and the resistance between any one of the first test pins on the path where the second detection line is located and any one of the second test pins on the path where the third detection line is located, the determining the bonding state of the display panel and the chip on film, the bonding state of the chip on film and the flexible circuit board and the state of the display panel, comprises:

when the resistance between the two first test pins on the path where the second detection line is located is infinite, and/or when the resistance between the two second test pins on the third detection line is infinite, determining that the chip on film and the flexible circuit board are in a poor bonding state; when the resistance between the two first test pins on the path where the second detection line is located is not infinite, and/or when the resistance between the two second test pins on the third detection line is not infinite, determining that the chip on film and the flexible circuit board are in a bonding state; and when a resistance value between any one of the first test pins and any one of the second test pins is infinite, determining that the display panel and the chip on film are in a poor bonding state; when the resistance value between any one of the first test pins and any one of the second test pins is not infinite, determining that the display panel and the chip on film are in a bonding state.

* * * * *